(12) United States Patent
Hatori et al.

(10) Patent No.: US 8,906,721 B2
(45) Date of Patent: Dec. 9, 2014

(54) SEMICONDUCTOR LIGHT EMITTING DEVICE AND METHOD FOR MANUFACTURING THE SAME

(71) Applicants: Fujitsu Limited, Kawasaki (JP); The University of Tokyo, Tokyo (JP)

(72) Inventors: Nobuaki Hatori, Kanagawa (JP); Tsuyoshi Yamamoto, Kawasaki (JP); Manabu Matsuda, Kawasaki (JP); Yasuhiko Arakawa, Kanagawa (JP)

(73) Assignees: Fujitsu Limited, Kawasaki (JP); The University of Tokyo, Tokyo (JP)

( * ) Notice: Subject to any disclaimer, the term of this patent is extended or adjusted under 35 U.S.C. 154(b) by 0 days.

(21) Appl. No.: 13/898,808

(22) Filed: May 21, 2013

(65) Prior Publication Data

US 2013/0267052 A1    Oct. 10, 2013

Related U.S. Application Data

(62) Division of application No. 12/199,507, filed on Aug. 27, 2008, now abandoned.

(30) Foreign Application Priority Data

Oct. 2, 2007 (JP) .................................. 2007-258862

(51) Int. Cl.
| | | |
|---|---|---|
| *H01S 5/12* | (2006.01) | |
| *B82Y 20/00* | (2011.01) | |
| *H01S 5/22* | (2006.01) | |
| *H01S 5/34* | (2006.01) | |
| *H01L 33/02* | (2010.01) | |
| *B82Y 40/00* | (2011.01) | |
| *H01L 33/30* | (2010.01) | |
| *H01S 5/343* | (2006.01) | |
| *H01S 5/042* | (2006.01) | |
| *H01S 5/30* | (2006.01) | |

(52) U.S. Cl.
CPC ................ *H01S 5/341* (2013.01); *H01S 5/221* (2013.01); *H01S 5/3412* (2013.01); *H01S 5/3403* (2013.01); *H01S 5/22* (2013.01); *H01L 33/02* (2013.01); *B82Y 40/00* (2013.01); *H01L 33/30* (2013.01); *Y10S 977/774* (2013.01); *H01S 5/12* (2013.01); *H01S 5/34313* (2013.01); *H01S 5/0424* (2013.01); *B82Y 20/00* (2013.01); *H01S 5/309* (2013.01)
USPC .................. 438/32; 438/22; 438/31; 977/774

(58) Field of Classification Search
CPC ........... H01S 5/34; H01S 5/341; H01S 5/343; H01S 5/34306; H01S 5/06258; H01S 5/1228; H01S 5/32391; H01S 5/22; H01S 5/309
USPC .................. 438/22, 31, 32; 372/50.11; 385/10
See application file for complete search history.

(56) References Cited

U.S. PATENT DOCUMENTS

| | | | | |
|---|---|---|---|---|
| 5,926,493 | A | * | 7/1999 | O'Brien et al. ............ 372/50.11 |
| 6,477,191 | B1 | | 11/2002 | Okada et al. |

(Continued)

FOREIGN PATENT DOCUMENTS

| | | | | |
|---|---|---|---|---|
| JP | 2000357841 | A | | 12/2000 |
| JP | 2002-289976 | A | | 10/2002 |
| JP | 2006-216752 | * | 8/2006 | ................ H01S 5/12 |
| JP | 2006-216752 | A | | 8/2006 |
| JP | 2006-286902 | A | | 10/2006 |
| WO | 2007066916 | A1 | | 6/2007 |

OTHER PUBLICATIONS

Japanese Office Action dated Nov. 22, 2011, issued in corresponding Japanese Patent Application No. 2007-258862.

(Continued)

*Primary Examiner* — Benjamin Sandvik
*Assistant Examiner* — Farid Khan
(74) *Attorney, Agent, or Firm* — Westerman, Hattori, Daniels & Adrian, LLP

(57) ABSTRACT

A method for manufacturing a semiconductor light emitting device includes forming a lower cladding layer over a GaAs substrate; forming a quantum dot active layer over the lower cladding layer; forming a first semiconductor layer over the quantum dot active layer; forming a diffraction grating by etching the first semiconductor layer; forming a second semiconductor layer burying the diffraction grating; and forming an upper cladding layer having a conductive type different from that of the lower cladding layer over the second semiconductor layer, wherein the processes after forming the quantum dot active layer are performed at a temperature not thermally deteriorating or degrading quantum dots included in the quantum dot active layer.

3 Claims, 10 Drawing Sheets

(56) References Cited

U.S. PATENT DOCUMENTS

| | | |
|---|---|---|
| 7,522,647 B2 | 4/2009 | Hatori et al. |
| 2002/0031152 A1* | 3/2002 | Funabashi et al. ............ 372/43 |
| 2002/0085605 A1* | 7/2002 | Hatori ............................ 372/50 |
| 2002/0114367 A1* | 8/2002 | Stintz et al. .................... 372/45 |
| 2002/0136255 A1 | 9/2002 | Takayama et al. |
| 2002/0186727 A1 | 12/2002 | Aoki |
| 2003/0170924 A1 | 9/2003 | Takiguchi |
| 2006/0043395 A1 | 3/2006 | Amano |
| 2006/0222028 A1 | 10/2006 | Hatori et al. |
| 2007/0195849 A1 | 8/2007 | Takagi et al. |
| 2008/0084906 A1 | 4/2008 | Takagi |
| 2008/0279243 A1* | 11/2008 | Oh et al. ................ 372/45.011 |

OTHER PUBLICATIONS

Hatori, N. et al.; "Fabrication of 1.3-μm Quantum-Dot Distributed Feedback Lasers with Vertical Grating"; Nano-photonic and Nano-electronic Devices Symposium; English translation of pp. 137-138; May 29, 2006.

Klopf, F. et al.; "1.3 μm Quantum Dot DFB Lasers"; 27th European Conference on Optical Communication.

Guimard, D. et al.; "High density InAs/GaAs quantum dots with enhanced photoluminescence intensity using antimony surfactant-mediated metal organic chemical vapor deposition"; Applied Physics Letters 89, 183124; 2006.

\* cited by examiner

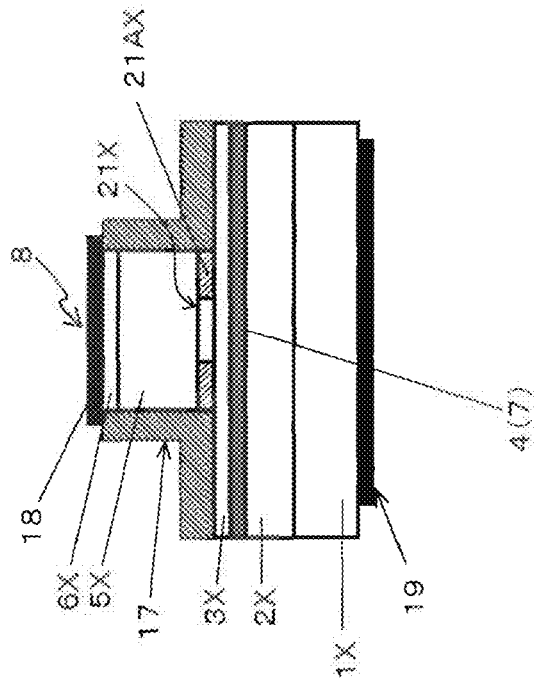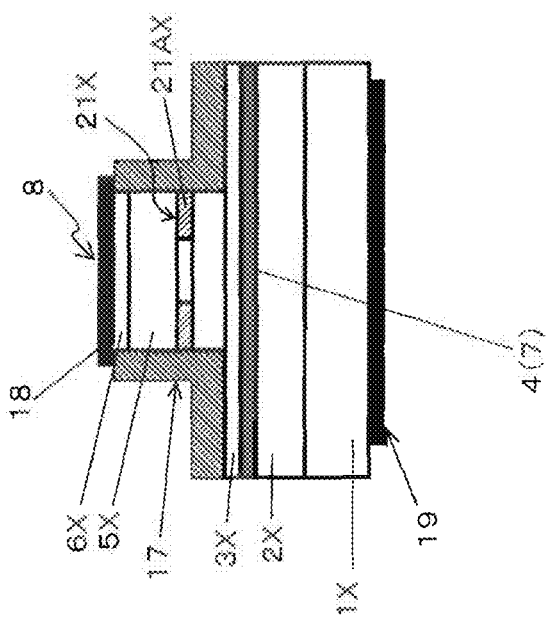

SEMICONDUCTOR LIGHT EMITTING DEVICE AND METHOD FOR MANUFACTURING THE SAME

CROSS REFERENCE TO RELATED APPLICATIONS

This application is a divisional application of U.S. patent application Ser. No. 12/199,507 filed Aug. 27, 2008, and is based on and claims the benefits of priority from Japanese Patent Application No. 2007-258862 filed on Oct. 2, 2007, the entire contents of which being incorporated herein by reference.

BACKGROUND (1) Field

This invention relates to a semiconductor light emitting device used as a light source for optical fiber communication, for example, and a method for manufacturing the semiconductor light emitting device, and specifically relates to a semiconductor light emitting device, which is formed on a GaAs substrate and has quantum dots in an active layer, and a method for manufacturing the semiconductor light emitting device.

(2) Description of the Related Art

In the prior art, as a method for manufacturing a DFB laser, there is widely used a method of growing crystal until an intermediate layer in a layer structure of a laser, forming a diffraction grating by patterning etching, and thereafter growing again the remaining layer in the layer structure of the laser.

SUMMARY

According to an aspect of an embodiment, there is a semiconductor light emitting device including a GaAs substrate, a quantum dot active layer formed over the GaAs substrate, a GaAs layer formed above or below the quantum dot active layer, and a diffraction grating formed from InGaP or InGaAsP and periodically provided along an propagating direction of light in the GaAs layer.

BRIEF DESCRIPTION OF THE DRAWINGS

FIGS. 9(A) and 9(B) are schematic cross sectional views showing a structure along a direction crosswise to the propagating direction of light of the semiconductor light emitting device (quantum dot DFB laser) according to a modification of the third embodiment.

DESCRIPTION OF THE PREFERRED EMBODIMENTS

Hereinafter, a semiconductor light emitting device and a manufacturing method for the same according to the embodiments are described with reference to the drawings.

[First Embodiment]

First, a semiconductor light emitting device and a manufacturing method for the same according to the first embodiment are described with reference to FIGS. 1 to 3(C).

Figure 1:
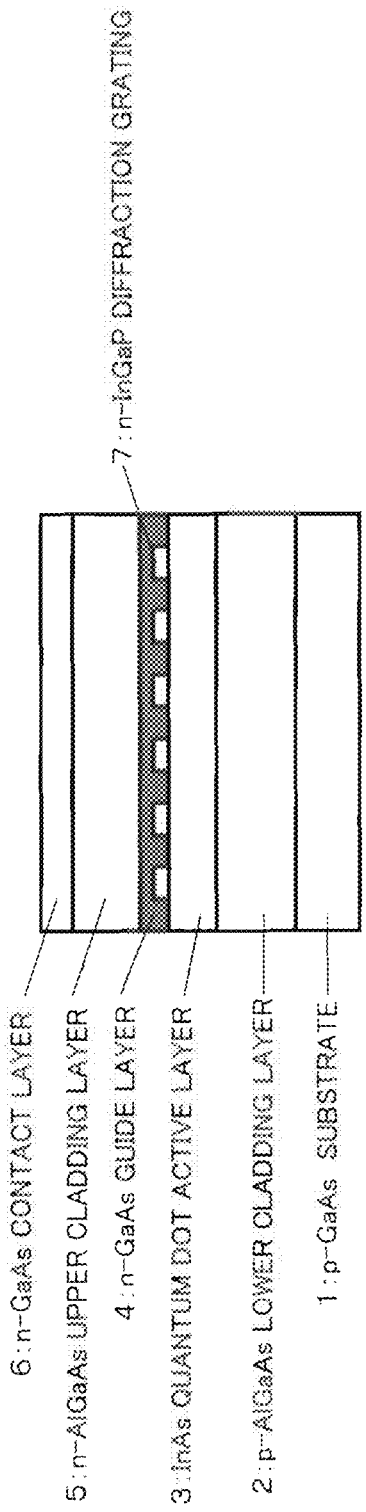
FIG. 1 is a schematic cross sectional view showing a structure along an propagating direction of light of a semiconductor light emitting device (quantum dot DFB laser) according to a first embodiment.

The semiconductor light emitting device according to this embodiment is formed on a GaAs substrate and has a quantum dot active layer and a diffraction grating (index coupled semiconductor light emitting device using quantum dot; index coupled DFB laser using quantum dot in this embodiment). As shown in FIG. 1, the semiconductor light emitting device is provided with a p-type GaAs substrate (p-type conductive substrate) 1, a p-type AlGaAs lower cladding layer 2 formed over the p-type GaAs substrate 1, a quantum dot active layer 3 formed over the p-type AlGaAs lower cladding layer 2, an n-type GaAs guide layer (n-type GaAs layer) 4 formed over the quantum dot active layer 3, an n-type AlGaAs upper cladding layer 5 formed over the n-type GaAs guide layer 4, and an n-type GaAs contact layer 6 formed over the n-type AlGaAs upper cladding layer 5.

Specifically, as shown in FIG. 1, the quantum dot semiconductor light emitting device in this embodiment has a stacked structure in which the p-type AlGaAs lower cladding layer 2, the quantum dot active layer 3, the n-type GaAs guide layer 4 including an n-type InGaP diffraction grating 7, the n-type AlGaAs upper cladding layer 5, and the n-type GaAs contact layer 6 are sequentially stacked on the p-type GaAs substrate 1.

The GaAs guide layer 4 includes the narrow line-shaped InGaP diffraction grating 7 which is formed from InGaP lattice-matched to GaAs and periodically provided along an propagating direction of light.

As an example of a method for manufacturing the DFB laser which is formed over the GaAs substrate and has a quantum well active layer, there is a method of etching an AlGaAs layer to form a diffraction grating, and, thus, to bury the diffraction grating with the GaAs layer (hereinafter referred to as first technique).

As a distributed-feedback semiconductor layer (quantum dot DFB laser) which is formed over the GaAs substrate and uses quantum dots in the active layer, there are quantum dots DFB laser (index coupled DFB laser using quantum dot)

having a refractive index coupled structure in which a diffraction grating is formed from a surface by etching, quantum dots DFB laser (loss coupled DFB laser using quantum dot) having an loss coupled structure using a metal diffraction grating, and other lasers.

However, in the material and method used in the first technique, since the AlGaAs layer is etched to form the diffraction grating, in the etching, the AlGaAs layer is exposed to be oxidized, whereby an oxide is formed on the surface of the AlGaAs layer. Thus, in fact, the diffraction grating formed by the AlGaAs layer cannot be buried with the GaAs layer.

In that case, a high temperature process for removing the oxide formed on the surface of the AlGaAs layer is required.

For instance, in the case of the DFB laser (quantum dot laser) forming a diffraction grating after the formation of the quantum dot active layer, quantum dots having a property unstable to a temperature is thermally deteriorated or degraded due to the high temperature process. For instance, the emission spectrum becomes not discrete. Therefore, the quantum dot laser cannot be manufactured by using the material and method used in the first technique.

In addition, in the case of the index coupled DFB laser using quantum dot formed as above mentioned, transverse mode control is difficult, whereby it is difficult to obtain a sufficient coupling constant (coupling coefficient).

Further, in the case of the loss coupled DFB laser using quantum dot, the threshold current (the threshold value) is easily raised.

Therefore, in the semiconductor light emitting device formed on the GaAs substrate and using the quantum dots in the active layer (quantum dot active layer), it is desirable that the diffraction grating can be formed in the semiconductor stacked structure, and, at the same time, it is also desirable that the transverse mode (fundamental mode) can be easily controlled, whereby a sufficient coupling constant can be obtained. Therefore, since higher-order transverse modes can be suppressed, the width of the ridge can be widen, thereby the resistance can be reduced.

In the semiconductor light emitting device forming the diffraction grating after the formation of the quantum dot active layer, it is desirable that the diffraction grating can be formed in the semiconductor stacked structure while preventing the quantum dot from being thermally deteriorated or degraded.

Therefore, this embodiment provides the above constitution.

Specifically, the diffraction grating is formed from InGaP, and it is difficult to form the oxide on the surface in the etching, and therefore, the InGaP diffraction grating 7 can be buried with the GaAs guide layer 4, whereby the diffraction grating 7 can be formed in the semiconductor stacked structure.

In addition, the InGaP diffraction grating 7 is buried with the GaAs guide layer 4, and a semiconductor material not containing Al is used, whereby it is difficult to form an oxide on the surface in the etching for the formation of the diffraction grating 7. Therefore, the high temperature process (high temperature processing) for removing the oxide is not required to be performed, whereby the processes after the formation of the quantum dot active layer 3 can be performed at a temperature lower than a temperature at which the quantum dot is thermally deteriorated or degraded. Thus, it is possible to prevent the quantum dot from being thermally deteriorated or degraded to change the emission wavelength and the emission intensity due to the high temperature process after the process of forming the quantum dot active layer 3. Thereby, the quantum dot semiconductor light emitting device (index coupled DFB laser using quantum dot) having the diffraction grating 7 in the semiconductor stacked structure can be manufactured without thermally deteriorating or thermally degrading the quantum dot.

In addition, since the InGaP diffraction grating 7 in the GaAs guide layer 4 is formed in a narrow line-shape, there is no GaAs/InGaP hetero-interface in the DFB laser which is formed on the GaAs substrate disclosed in Japanese Patent Application Laid-Open No. HEI 7-263802. Thus, there is an effect of preventing increase of the device resistance.

Further, since the difference between the refractive indices of InGaP composing the diffraction grating 7 and GaAs used for burying the diffraction grating 7 is large, a large coupling constant can be designed.

In this embodiment, the n-type GaAs guide layer 4 is provided between the quantum dot active layer 3 and the n-type AlGaAs upper cladding layer 5.

As above, in this embodiment, since the upper cladding layer 5 has an n-type conductivity, the GaAs guide layer 4 including the InGaP diffraction grating 7 is provided on the n-type cladding layer side. In general, an electric current is less likely to flow in a semiconductor layer having a diffraction grating; however, in this embodiment, the diffraction grating is provided on the n-type cladding layer side through which electrons with small effective mass pass, whereby the resistance becomes smaller than in the case of providing the diffraction grating on the p-type cladding layer side through which holes with large effective mass pass.

Figure 2:
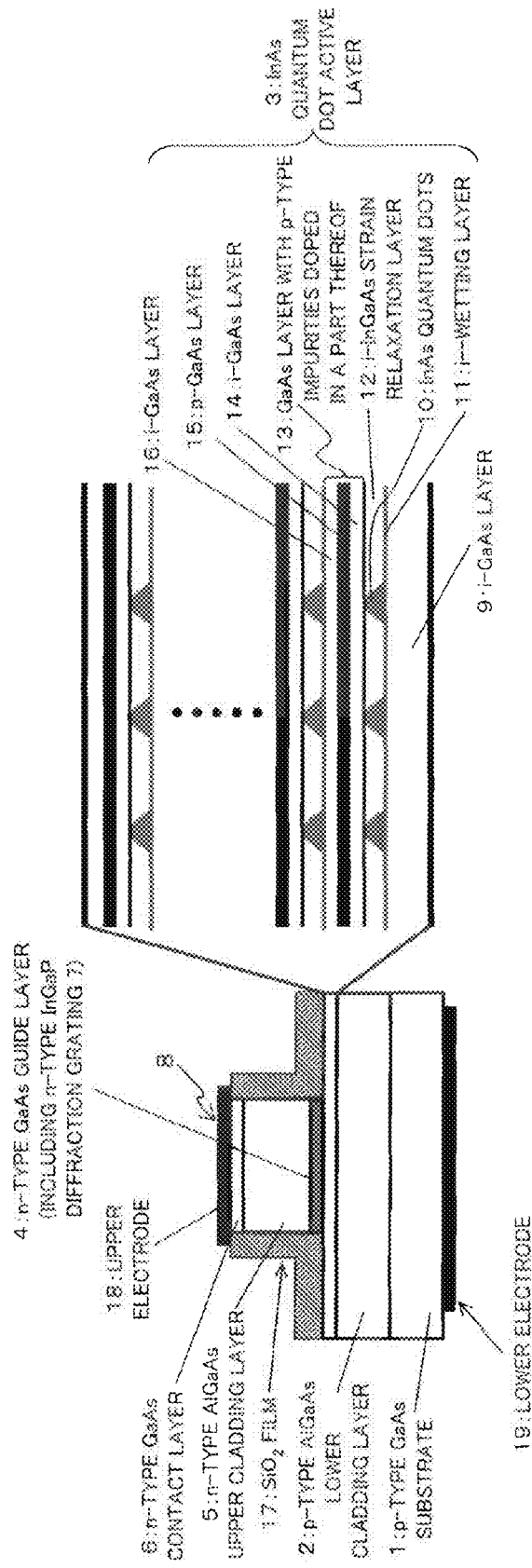
FIG. 2 is a schematic cross sectional view showing a structure along a direction crosswise to the propagating direction of light of the semiconductor light emitting device (quantum dot DFB laser) according to the first embodiment.

In addition, as shown in FIG. 2, the quantum dot semiconductor light emitting device in this embodiment is constituted as a ridge waveguide type quantum dot semiconductor light emitting device (ridge waveguide type quantum dot DFB laser) having a ridge structure (stripe structure; stripe-shaped mesa structure) 8 including an n-type GaAs contact layer 6, an n-type AlGaAs upper cladding layer 5, and an n-type GaAs guide layer 4.

The upper surface of the quantum dot active layer 3 is exposed on the opposite sides (both sides) of the ridge structure 8. Namely, the quantum dot active layer 3 extends to the end face of the p-type GaAs substrate 1.

As above, the GaAs guide layer 4 including the InGaP diffraction grating 7 is removed, and the ridge structure 8 is formed so that the quantum dot active layer 3 is exposed, whereby the coupling constant of a transverse fundamental mode to the diffraction grating is increased, and there is an effect of suppressing higher-order transverse modes.

In this embodiment, the quantum dot active layer 3 is an InAs quantum dot active layer containing in apart thereof p-type impurities and having the emission wavelength of 1.3 μm. As shown in FIG. 2, the quantum dot active layer 3 has a stacked structure in which a layer (quantum dot layer) composed of InAs quantum dots 10, an i-InAs wetting layer 11, an i-InGaAs strain relaxation layer (side barrier layer) 12 formed to cover the InAs quantum dots 10, and a GaAs layer 13 (barrier layer; p-type doped layer; in this embodiment, the GaAs layer 13 is composed of an i-GaAs layer 14, a p-GaAs layer 15, and an i-GaAs layer 16) with the p-type impurities doped in a part thereof are repeatedly stacked a plurality of times (10 times in this embodiment) on the i-GaAs layer (barrier layer) 9. The number of the stacked layers in the quantum dot active layer 3 is not limited to the above, and can be changed depending on the intended use of the semiconductor light emitting device, for example.

The constitution of the quantum dot active layer 3 is not limited to the above. By way of the example, although in this embodiment the quantum dot active layer 3 has the GaAs barrier layer 13 with the p-type impurities doped in a part thereof (that is, the GaAs barrier layer 13 includes the p-GaAs layer 15), the quantum dot active layer 3 may be constituted so that at least one of the quantum dots 10, the wetting layer 11, the barrier layers 9 and 13, and the side barrier layer 12 which constitute the quantum dot active layer 3 is a layer (p-type quantum dot active layer) with the p-type impurities doped therein. Since the quantum dot active layer 3 is the p-type quantum dot active layer, the temperature characteristic of the device can be substantially improved, whereby the quantum dot semiconductor light emitting device (quantum dot DFB laser in this embodiment) with an excellent temperature characteristic can be realized.

In this embodiment, the quantum dot active layer 3 is the p-type quantum dot active layer, the lower cladding layer 2 formed over the lower side of the quantum dot active layer 3 is formed from p-type AlGaAs, and the upper cladding layer 5 included in the ridge structure 8 is formed from n-type AlGaAs, whereby the ridge structure (ridge waveguide) with a small area of p-n heterojunction can be formed, and, at the same time, the ridge waveguide type quantum dot semiconductor light emitting device with a small capacitance can be manufactured.

As shown in FIG. 2, an insulating layer ($SiO_2$ film) 17 formed from $SiO_2$ and an upper electrode (n-side electrode) 18 are formed on the surface of the device, and a lower electrode (p-side electrode) 19 is formed on the bottom face of the device.

As a cavity structure of the device, although there are various possible structures depending on the design, a structure, in which, when the device length is 300 μm, an anti-reflection coating is applied to the front facet (end face) and a high reflection coating is applied to the back facet (end face), may be applied.

Next, a method for manufacturing a semiconductor light emitting device according to this embodiment is described.

The method for manufacturing the semiconductor light emitting device includes forming the lower cladding layer 2 over the GaAs substrate 1, forming the quantum dot active layer 3 over the lower cladding layer 2, forming a first semiconductor layer 7A over the quantum dot active layer 3, forming the diffraction grating 7 by etching the first semiconductor layer 7A, forming the guide layer (second semiconductor layer) 4 burying (covering) the diffraction grating 7, forming the upper cladding layer 5 having an conductive type different from that of the lower cladding layer 2 over the guide layer 4, and forming the contact layer 6 over the upper cladding layer 5 [see, FIGS. 1 and 3(A) to 3(C)].

The processes after the process of forming the quantum dot active layer 3 are performed at a temperature not thermally deteriorating or degrading the quantum dots. This is because, when the quantum dots are thermally deteriorated or degraded, the emission wavelength of the quantum dots is shifted to the short wavelength side by about 100 nm from the emission wavelength before the deterioration or degradation, whereby it is necessary to prevent the emission wavelength of the quantum dots from being deviated from an intended emission wavelength.

Hereinafter, the method for manufacturing the semiconductor light emitting device in this embodiment is specifically described.

Figure 3A:
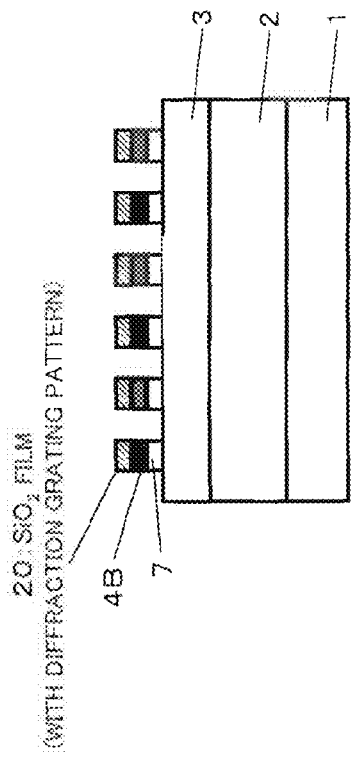
FIGS. 3(A) to 3(C) are schematic cross sectional views for explaining a method for manufacturing the semiconductor light emitting device (quantum dot DFB laser) according to the first embodiment.

As shown in FIG. 3A, the p-AlGaAs lower cladding layer 2 (in this embodiment, p-$Al_{0.35}Ga_{0.65}As$ lower cladding layer), the InAs quantum dot active layer 3 with the emission wavelength of 1.3 μm (a layer, which is composed of the InAs quantum dots 10, the i-wetting layer 11, and the i-InGaAs strain relaxation layer 12, and the GaAs layer 13 with the p-type impurities doped in a part thereof are repeatedly stacked 10 times on the i-GaAs layer 9 to form the InAs quantum dot active layer 3 (see, FIG. 2)) are sequentially stacked on the p-GaAs substrate (p-type conductive substrate) 1 by a molecular beam growth method (MBE method) for example (first growth).

In this embodiment, the processes after forming the InAs quantum dot active layer 3, that is, the following processes are performed at a temperature not thermally deteriorating or degrading the quantum dots (at a temperature not changing the emission wavelength and the emission intensity of the quantum dots).

The InAs quantum dots according to this embodiment is not thermally deteriorated or degraded at 630° C. or less. Namely, the emission wavelength of the InAs quantum dots is not changed at 630° C. or less (atmosphere temperature) (see, Denis Guimard et al., "High density InAs/GaAs quantum dots with enhanced photoluminescence intensity using antimony surfactant-mediated metal organic chemical vapor deposition", APPLIED PHYSICS LETTERS 89, 183124 (2006)). Thus, the following processes are performed at 630° C. or less, whereby, as described below, the quantum dot semiconductor light emitting device (index coupled DFB laser using quantum dot) having the diffraction grating 7 in the semiconductor stacked structure can be manufactured without thermally deteriorating or degrading the InAs quantum dots.

In this embodiment, although the temperature at which the quantum dots are not thermally deteriorated or degraded is not more than 630° C., if in future the quantum dots can be formed at a higher temperature without being thermally deteriorated or degraded (namely, without changing the emission wavelength and the emission intensity of the quantum dots), the higher temperature can be set as the temperature not thermally deteriorating or degrading the quantum dots (temperature not changing the emission wavelength and the emission intensity of the quantum dots).

Specifically, first, as shown in FIG. 3(A), the n-InGaP layer 7A and an n-GaAs layer 4A are sequentially stacked on the InAs quantum dot active layer 3 at 600° C. for example by a metal organic chemical vapor deposition method (MOCVD method) for example (second growth).

Figure 3B:
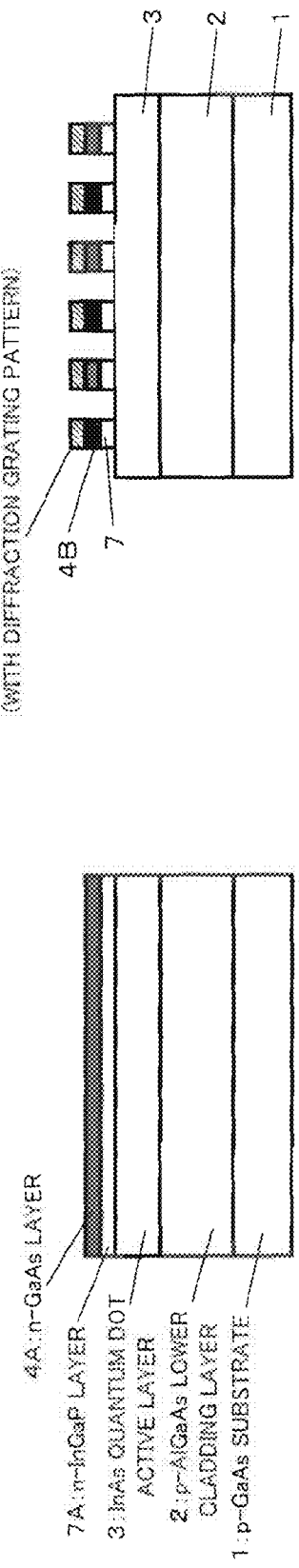

Second, as shown in FIG. 3(B), the $SiO_2$ film is formed over the n-GaAs layer 4A to form the diffraction grating pattern by the $SiO_2$ film 20 using an electron beam exposure method and an interference exposure method, for example.

As shown in FIG. 3(B), when the $SiO_2$ film 20 having the diffraction grating pattern is used as an etching mask, an n-GaAs layer is subjected to selective etching using a sulfuric acid-based etchant, and an n-InGaP layer is subjected to selective etching using a hydrochloric acid-based etchant. Thereby the narrow line-shaped n-InGaP diffraction grating 7 periodically provided along an propagating direction of light is formed. An n-GaAs cap layer 4B is formed over the n-InGaP diffraction grating 7. In comparison with the case of forming the diffraction grating from the surface by etching, such a narrow line-shaped diffraction grating 7 can be easily formed.

As above, in this embodiment, the process of forming the n-GaAs layer 4A over the n-InGaP layer 7A is included after the process of forming the n-InGaP layer (first semiconductor layer) 7A, and before forming the diffraction grating 7 [see, FIG. 3(A)]. As shown in FIG. 3(B), in the process of forming the diffraction grating 7, the n-GaAs layer 4A and the n-InGaP layer 7A are etched to form the n-InGaP diffraction grating 7 having the n-GaAs cap layer 4B on an upper part thereof.

Figure 3C:
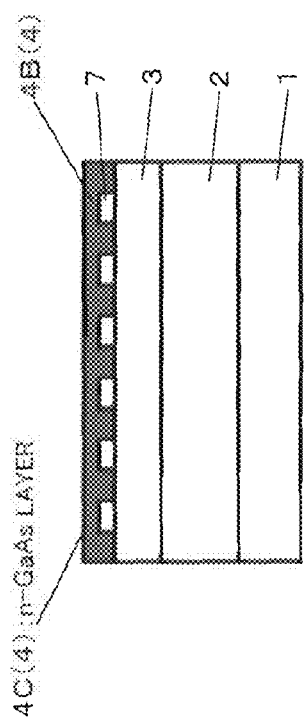

Thereafter, the SiO$_2$ film 20 is removed, and, as shown in FIG. 3(C), by the MOCVD method for example, the temperature is raised in an atmosphere of PH$_3$ which is a P material until 400° C. to prevent P from desorbing from the n-InGaP diffraction grating 7. Then, Ga is supplied in an atmosphere of AsH$_3$ which is an As material at 400° C. to grow an n-GaAs buried layer 4C with a small thickness so that the n-GaAs buried layer 4C covers the n-InGaP diffraction grating 7 having the n-GaAs cap layer 4B on an upper part thereof. The supplying of Ga is temporarily stopped, the temperature is raised at 600° C. while flowing AsH$_3$, and thereafter, Ga is supplied in the AsH$_3$ atmosphere to grow the n-GaAs buried layer 4C, whereby the n-GaAs guide layer 4 including the n-InGaP diffraction grating 7 is formed. The n-GaAs guide layer 4 is constituted of the n-GaAs cap layer 4B and the n-GaAs buried layer 4C.

As above, in this embodiment, in the process of forming the n-GaAs guide layer (second semiconductor layer) 4, the n-GaAs buried layer 4C is grown such that the n-InGaP diffraction grating 7 having the n-GaAs cap layer 4B on an upper part thereof is buried in the n-GaAs buried layer 4C to form the n-GaAs guide layer 4. According to this constitution, when the n-InGaP diffraction grating 7 is buried (covered) with the n-GaAs guide layer 4, the degradation of the shape of the n-InGaP diffraction grating 7 (for example, degradation due to the desorption of P) can be prevented.

In this embodiment, the diffraction grating is formed from InGaP, and an oxide is less likely to be formed on the surface in the etching, whereby the InGaP diffraction grating 7 can be buried with the n-GaAs guide layer 4, that is, the diffraction grating 7 can be formed in the semiconductor stacked structure.

Meanwhile, since the InGaP diffraction grating 7 is buried with the GaAs guide layer 4, and the semiconductor material not containing Al is used, whereby an oxide is less likely to be formed on the surface in the etching for the formation of the diffraction grating 7. Therefore, the high temperature process (high temperature processing) for removing the oxide is not required to be performed, and, at the same time, the processes after the formation of the quantum dot active layer 3 can be performed at a temperature lower than the temperature thermally deteriorating or degrading the quantum dots. Thus, it is possible to prevent the quantum dots from being thermally deteriorated or degraded due to the high temperature process after the process of forming the quantum dot active layer 3, whereby it is also possible to prevent the change of the emission wavelength and the emission intensity. Accordingly, the quantum dot semiconductor light emitting device (index coupled DFB laser using quantum dot) having the diffraction grating 7 in the semiconductor stacked structure can be manufactured without thermally deteriorating or degrading the quantum dots.

Next, the n-AlGaAs upper cladding layer 5 (in this embodiment, n-Al$_{0.35}$Ga$_{0.65}$As upper cladding layer) and the n-GaAs contact layer 6 are sequentially stacked at 600° C. (third growth, see FIG. 1).

Thereafter, the SiO$_2$ film is formed, and the ridge waveguide pattern is formed on the SiO$_2$ film by using a photolithography technique, for example.

Then, the SiO$_2$ film with the ridge waveguide pattern formed therein is used as a mask, and the pattern is transferred to the n-GaAs contact layer 6, the n-AlGaAs upper cladding layer 5, and the n-GaAs guide layer 4 including the n-InGaP diffraction grating 7 by chlorine-based dry etching, for example (namely, regarding the n-GaAs contact layer 6, the n-AlGaAs upper cladding layer 5, and the n-GaAs guide layer 4 including the n-InGaP diffraction grating 7, each part which is not covered with the SiO$_2$ mask is removed) to expose the InAs quantum dot active layer 3, whereby the ridge structure 8, which includes the n-GaAs contact layer 6, the n-AlGaAs upper cladding layer 5, and the n-GaAs guide layer 4 including the n-InGaP diffraction grating 7, is formed (see, FIG. 2).

Thereafter, the SiO$_2$ mask is removed to form an SiO$_2$ passivation film (SiO$_2$ film) 17 (see, FIG. 2) so as to cover the ridge structure 8. Then, electrodes 18 and 19 for electrical current injection are formed in the upper and lower parts of the ridge structure 8 (see, FIG. 2). In addition, the facet coating is applied after cleavage in array form. For instance, when the device length is 300 μm, the anti-reflection coating may be applied to the front facet, and the high reflection coating may be applied to the back facet.

According to the semiconductor light emitting device and the method for manufacturing the semiconductor light emitting device according to this embodiment, in the semiconductor light emitting device which is formed on the GaAs substrate 1 and uses the quantum dots in the active layer 3, the diffraction grating 7 can be formed in the semiconductor stacked structure by a manufacturing method (regrowth technique) which, after the semiconductor layer 7A is grown and the diffraction grating 7 is formed by etching, other semiconductor layer 4 is grown again, and at the same time, there is an advantage that the transverse mode can be easily controlled, whereby a sufficient coupling constant can be obtained. Additionally, there is also an advantage that, in comparison with the loss coupled DFB laser using quantum dot, the threshold current can be lowered.

Especially, in the semiconductor light emitting device in which the diffraction grating 7 is formed after the formation of the quantum dot active layer 3, there is also an advantage that the diffraction grating 7 can be formed in the semiconductor stacked structure while preventing the quantum dots from being thermally deteriorated or degraded (namely, without undergoing the high temperature process).

In the first embodiment, although the diffraction grating 7 is formed from the n-type InGaP, it may be formed from, for example, undoped InGaP (i-InGaP) in which n-type impurities are not doped. However, in this case, an electric current is less likely to flow to cause increase of resistance. In addition, for instance, the diffraction grating may be formed from n-type InGaAsP or undoped InGaAsP (i-InGaAsP) lattice-matched to GaAs.

In addition, in the first embodiment, although the guide layer 4 (diffraction grating buried layer) including the diffraction grating 7 is formed from n-type GaAs, it may be formed from, for example, undoped GaAs (i-GaAs) in which the n-type impurities are not doped. However, in this case, the device resistance is increased.

Further, in the first embodiment, although a ridge bottom face is formed by the GaAs guide layer 4 including the diffraction grating 7 to expose the quantum dot active layer 3 over the opposite sides of the ridge structure 8 (see, FIG. 2), the ridge bottom face may be formed at an intermediate part of the GaAs guide layer to expose the GaAs guide layer on the opposite sides of the ridge structure.

In addition, since the diffraction grating is present outside of the ridge waveguide whereby the diffraction grating is easily coupled with the higher-order transverse modes, it is necessary to pay attention to the presence of the higher-order transverse modes.

Further, in the first embodiment, although the quantum dot active layer 3 is the p-type quantum dot active layer with the p-type impurities doped in a part thereof, it may be constituted as an undoped quantum dot active layer without the p-type impurities.

Further, in the first embodiment, although the upper cladding layer 5 and the lower cladding layer 2 are formed from AlGaAs, it may be formed from InGaP, for example. In this case, although the resistance and heat-resistance tend to be increased in comparison with the case in which those layers are formed from AlGaAs, there is an effect that the index coupled semiconductor light emitting device using quantum dot (index coupled DFB laser using quantum dot) can be manufactured while suppressing the thermal degradation of the quantum dots, because, as with the case in which the upper cladding layer 5 and the lower cladding layer 2 are formed from AlGaAs, these layers can be grown at a temperature lower than the temperature thermally deteriorating or degrading the quantum dots.

Further, in the first embodiment, the diffraction grating 7 may be constituted to have λ/4 wavelength shift.

Further, in the first embodiment, the composition ratio between the p-AlGaAs cladding layer and the n-AlGaAs cladding layer is not limited to the above. In addition, the composition of the upper and lower cladding layers are not required to be the same.

Further, in the first embodiment, although each layer is grown by the combination of the MBE method and the MOCVD method, it may be grown by any one growth method of the MBE method, the MOCVD method, a gas source MBE method, and other methods, or these methods may be appropriately combined to grow each layer.

However, in the MBE method, since cleaning by annealing process (heat treatment) is required before growth, the MBE method is not unsuitable for the regrowth process. When the first and second growth in the first embodiment are performed by the same growth method, it is preferable that the first and second growth are continuously performed.

Further, in the first embodiment, although the diffraction grating 7 is formed by wet etching, it may be formed by dry etching, for example, and it may be formed by the combination of the dry etching and the wet etching. When the diffraction grating is formed by the dry etching, a resist maybe used as an etching mask instead of the $SiO_2$ film. However, it is preferable that the selective etching is used for the interface part between the active layer and the diffraction grating.

Further, in the first embodiment, since the uppermost layer of the quantum dot active layer 3 is the i-GaAs layer 16 (see, FIG. 2), the n-InGaP layer 7A and the n-GaAs layer 4A are sequentially stacked on the i-GaAs layer 16 [see, FIG. 3(A)] and etched to form the diffraction grating 7, and thereafter, to grow the n-GaAs buried layer 4C, whereby the n-GaAs guide layer 4 is formed [see, FIG. 3(B)]. However, an n-GaAs layer, an n-InGaP layer, an n-GaAs layer are sequentially stacked on the quantum dot active layer 3 and etched to form the diffraction grating 7, and thereafter, to grow the n-GaAs buried layer, whereby n-GaAs guide layer 4 may be formed.

In this case, since the n-GaAs layer is formed below the diffraction grating 7, that is, between the quantum dot active layer 3 and the n-InGaP layer 7A forming the diffraction grating 7, in the etching for forming the diffraction grating 7, the etching only has to be stopped at the intermediate part of the n-GaAs layer formed below the diffraction grating 7. Therefore, even if the selective etching is not used for the formation of the diffraction grating 7, the narrow line-shaped diffraction grating 7 can be formed.

Figure 4:
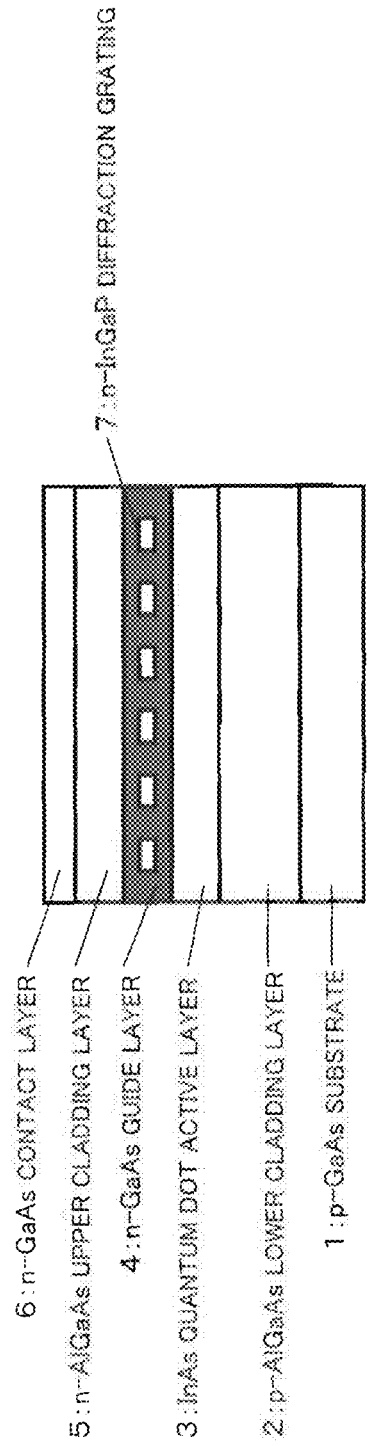
FIG. 4 is a schematic cross sectional view showing a structure along the propagating direction of light of a semiconductor light emitting device (quantum dot DFB laser) according to a modification of the first embodiment.

In the semiconductor light emitting device (index coupled semiconductor light emitting device using quantum dot; index coupled DFB laser using quantum dot in this embodiment) manufactured as above described, as shown in FIG. 4, the n-GaAs guide layer 4 has the n-GaAs layer also below the diffraction grating 7, that is, between the quantum dot active layer 3 and the diffraction grating 7.

[Second Embodiment]

Next, a semiconductor light emitting device and a method for manufacturing the semiconductor light emitting device according to the second embodiment are described with reference to FIGS. 5 and 6.

The semiconductor light emitting device according to the second embodiment is different from the first embodiment and the modification in having a current blocking layer.

Figure 5:
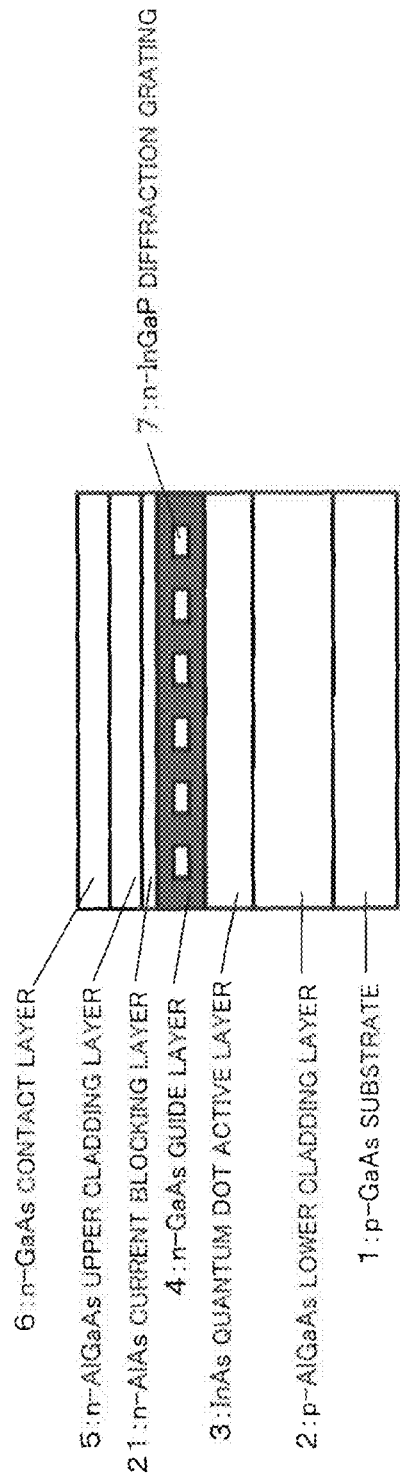
FIG. 5 is a schematic cross sectional view showing a structure along an propagating direction of light of a semiconductor light emitting device (quantum dot DFB laser) according to a second embodiment.
Figure 6:
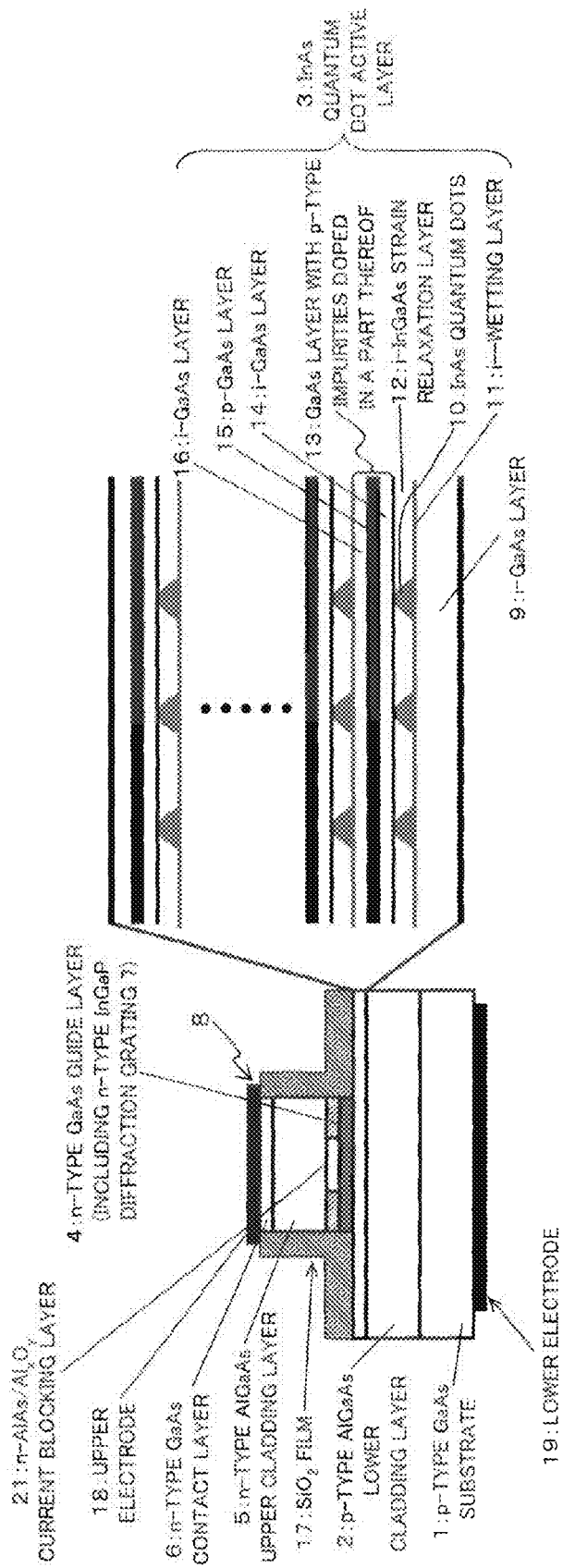
FIG. 6 is a schematic cross sectional view showing a structure along a direction crosswise to the propagating direction of light of the semiconductor light emitting device (quantum dot DFB laser) according to the second embodiment.

Namely, as shown in FIGS. 5 and 6, the semiconductor light emitting device is provided with, above a GaAs layer (GaAs guide layer) 4, an n-type AlAs current blocking layer 21 having a current blocking part 21A (formed from an AlAs oxide film ($Al_xO_y$) obtained by oxidizing an AlAs layer, in this embodiment) adjacent to the side of the ridge structure (ridge waveguide) 8. In FIGS. 5 and 6, components same as those in the first embodiment (see, FIGS. 1 and 2) and the modification (see, FIG. 4) are represented by same numbers.

Specifically, as shown in FIGS. 5 and 6, the semiconductor light emitting device (index coupled semiconductor light emitting device using quantum dot; index coupled DFB laser using quantum dot in the present embodiment) is provided with a p-type GaAs substrate (p-type conductive substrate) 1, a p-type AlGaAs lower cladding layer 2 formed over the p-type GaAs substrate 1, a quantum dot active layer 3 formed over the p-type AlGaAs lower cladding layer 2, an n-type GaAs guide layer 4 formed over the quantum dot active layer 3 and including an n-type InGaP diffraction grating 7, an n-type AlAs current blocking layer 21 formed over the n-type GaAs guide layer 4, an n-type AlGaAs upper cladding layer 5 formed over the n-type AlAs current blocking layer 21, and an n-type GaAs contact layer 6 formed over the n-type AlGaAs upper cladding layer 5.

In other words, as shown in FIGS. 5 and 6, the quantum dot semiconductor light emitting device in this embodiment has a stacked structure in which the p-type AlGaAs lower cladding layer 2, the quantum dot active layer 3, the n-type GaAs guide layer 4 including an n-type InGaP diffraction grating 7, the n-type AlAs current blocking layer 21, the n-type AlGaAs upper cladding layer 5, and the n-type GaAs contact layer 6 are sequentially stacked over the p-type GaAs substrate 1.

Since other constitution is the same as that of the first embodiment and the modification, the description is omitted here.

Next, a method for manufacturing the semiconductor light emitting device according to this embodiment is described.

First, as with the case of the first embodiment and the modification, the p-type AlGaAs lower cladding layer 2, the quantum dot active layer 3, and the n-GaAs guide layer 4 including the narrow line-shaped n-InGaP diffraction grating 7 are formed on the p-type GaAs substrate 1 [see, FIG. 3(A)].

Second, the n-AlAs current blocking layer 21, the n-AlGaAs upper cladding layer 5, and the n-GaAs contact layer 6 are sequentially stacked at 600° C. (third growth; see, FIG. 5).

Thereafter, the $SiO_2$ film is formed, and the ridge waveguide pattern is formed on the $SiO_2$ film by using a photolithography technique, for example.

Then, the $SiO_2$ film with the ridge waveguide pattern formed therein is used as a mask, and the pattern is transferred to the n-GaAs contact layer 6, the n-AlGaAs upper cladding layer 5, the n-AlAs current blocking layer 21, and the n-GaAs guide layer 4 including the n-InGaP diffraction grating 7 by chlorine-based dry etching, for example (namely, regarding the n-GaAs contact layer 6, the n-AlGaAs upper cladding layer 5, the n-AlAs current blocking layer 21, and the n-GaAs guide layer 4 including the n-InGaP diffraction grating 7, each part which is not covered with the SiO$_2$ mask is removed) to expose the InAs quantum dot active layer 3, whereby the ridge structure 8, which includes the n-GaAs contact layer 6, the n-AlGaAs upper cladding layer 5, the n-AlAs current blocking layer 21, and the n-GaAs guide layer 4 including the n-InGaP diffraction grating 7, is formed (see, FIG. 6).

Next, the n-AlAs current blocking layer 21 is oxidized under a water vapor atmosphere to form a current blocking part 21A, which is formed from AlAs oxide film (Al$_x$O$_y$), adjacent to the side of the ridge waveguide 8 (see, FIG. 6).

Thereafter, the SiO$_2$ mask is removed, and an SiO$_2$ passivation film (SiO$_2$ film) 17 is formed so as to cover the ridge structure 8 (see, FIG. 6). Then, electrodes 18 and 19 for electrical current injection are formed at the top and the bottom (see, FIG. 6). In addition, the facet coating is applied after cleavage in array form. For instance, when the device length is 300 μm, the anti-reflective coating may be applied to the front facet and the high reflective coating may be applied to the back facet.

Thus, according to the semiconductor light emitting device and the method for manufacturing the semiconductor light emitting device according to this embodiment, in addition to the effects of the first embodiment and the modification, since a current blocking structure using the AlAs oxide film (Al$_x$O$_y$) is formed, there is an advantage that the semiconductor light emitting device (index coupled DFB laser), in which a threshold current is lowered without reducing the contact resistance, can be realized.

In the second embodiment, although the n-AlAs current blocking layer 21 is provided above the GaAs guide layer (GaAs layer) 4, it is not limited thereto.

For instance, an n-AlAs current blocking layer may be provided below the GaAs layer 4 (namely, between the GaAs layer 4 and the quantum dot active layer 3) (in this case, the AlAs current blocking layer forms the ridge bottom face). However, in this case, the diffraction grating is separated from the active layer, whereby the coupling constant tends to be reduced.

In addition, for instance, the n-AlGaAs current blocking layer may be provided above the GaAs layer 4, or may be provided below the GaAs layer 4 (namely, between the GaAs layer 4 and the quantum dot active layer 3). However, in this case, if the composition of Ga in the n-AlGaAs current blocking layer is large, the speed of formation of the current blocking part by oxidation is reduced.

In the second embodiment, as with the case of the first embodiment and the modification, the presence or absence of doping in the InGaP diffraction grating and the guide layer, the growth method and the frequency of growth, the depth of the ridge, the method for ridge formation, the method for diffraction grating formation, a diffraction grating material, the number of stacked layers in the quantum dot active layer, the AlGaAs composition ratio in the cladding layer, a cladding layer material, the presence or absence of the λ/4 wavelength shift structure in the diffraction grating, and so on can be changed into various forms.

[Third Embodiment]

Next, a semiconductor light emitting device and a method for manufacturing the semiconductor light emitting device according to the third embodiment are described with reference to FIGS. 7 and 8.

Figure 7:
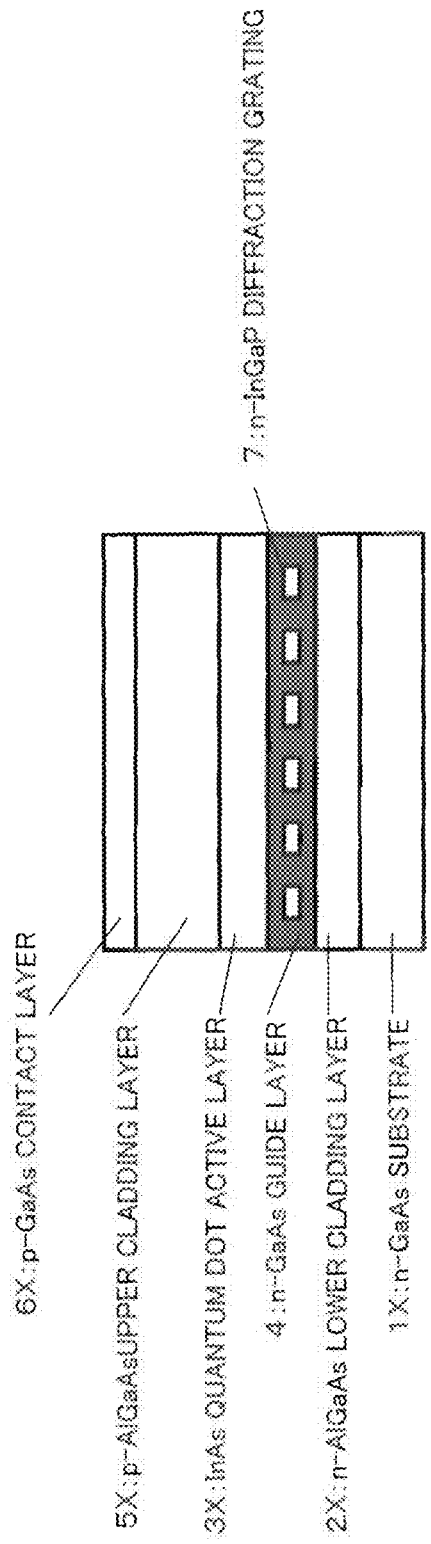
FIG. 7 is a schematic cross sectional view showing a structure along an propagating direction of light of a semiconductor light emitting device (quantum dot DFB laser) according to a third embodiment.
Figure 8:
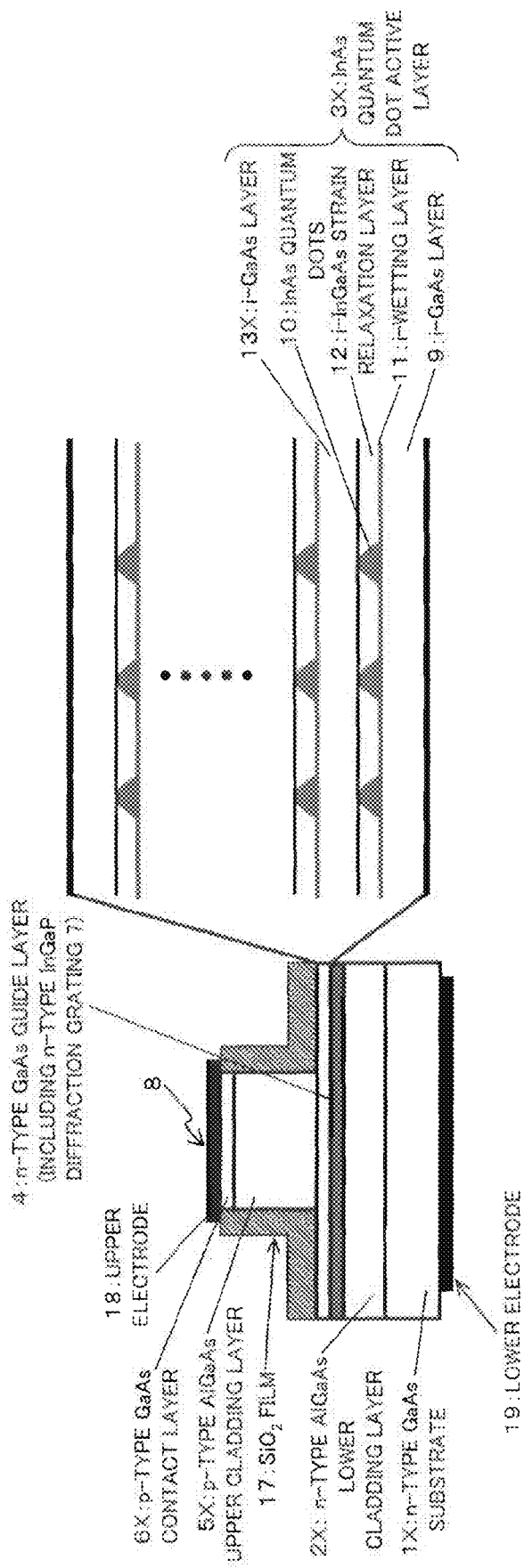
FIG. 8 is a schematic cross sectional view showing a structure along a direction crosswise to the propagating direction of light of the semiconductor light emitting device (quantum dot DFB laser) according to the third embodiment.

As shown in FIGS. 7 and 8, the semiconductor light emitting device according to this embodiment is different from the semiconductor light emitting device according to the first embodiment and the modification in that it is formed on an n-type GaAs substrate (n-type conductive substrate) 1X and a GaAs guide layer (GaAs layer) 4 is provided below a quantum dot active layer 3X, that is, provided between the quantum dot active layer 3X and a lower cladding layer 2X. In FIGS. 7 and 8, the components same as those in the first embodiment (see, FIGS. 1 and 2) and the modification (see, FIG. 4) are represented by same numbers.

Specifically, as shown in FIGS. 7 and 8, the semiconductor light emitting device (index coupled semiconductor light emitting device using quantum dot; index coupled DFB laser using quantum dot in the present embodiment) is provided with the n-type GaAs substrate (n-type conductive substrate) 1X, an n-type AlGaAs lower cladding layer 2X (in this embodiment, n-Al$_{0.35}$Ga$_{0.65}$As lower cladding layer) formed over the n-type GaAs substrate 1X, the n-type GaAs guide layer 4, which is formed over the n-type AlGaAs lower cladding layer 2X and includes an n-type InGaP diffraction grating 7, the quantum dot active layer 3X formed over the n-type GaAs guide layer 4, a p-type AlGaAs upper cladding layer 5X (in this embodiment, p-Al$_{0.35}$Ga$_{0.65}$As upper cladding layer) formed over the quantum dot active layer 3X, and a p-type GaAs contact layer 6X formed over the p-type AlGaAs upper cladding layer 5X.

Specifically, as shown in FIGS. 7 and 8, the quantum dot semiconductor light emitting device in this embodiment has a stacked structure in which the n-type AlGaAs lower cladding layer 2X, the n-type GaAs guide layer 4 including the n-type InGaP diffraction grating 7, the quantum dot active layer 3X, the p-type AlGaAs upper cladding layer 5X, and the p-type GaAs contact layer 6X are sequentially stacked on the n-type GaAs substrate 1X.

In especially, since the diffraction grating 7 is formed from InGaP, an oxide is difficult to be formed on a surface in the etching, and the diffraction grating 7 can be buried with the GaAs layer 4, whereby the diffraction grating 7 can be formed in the semiconductor stacked structure.

Like this embodiment, when the diffraction grating 7 is formed before the formation of the quantum dot active layer 3X, the GaAs guide layer 4 is required to be formed to have a large thickness for the purpose of burying the diffraction grating 7 completely flatly. Thus, it is necessary to pay attention to that the coupling constant tends to be reduced.

In the present embodiment, as shown in FIG. 8, the quantum dot active layer 3X is the undoped InAs quantum dot active layer (i-InAs quantum dot active layer) 3X in which the p-type impurities are not doped, and has a stacked structure in which a layer (quantum dot layer) composed of InAs quantum dots 10, an i-InAs wetting layer 11, an i-InGaAs strain relaxation layer (side barrier layer) 12 formed to cover the InAs quantum dots 10, and an i-GaAs layer (barrier layer) 13X are repeatedly stacked a plurality of times (10 times in this embodiment) on an i-GaAs layer (barrier layer) 9. The number of the stacked layers in the quantum dot active layer 3X is not limited to the above, and can be changed depending on the intended use of the semiconductor light emitting device, for example.

In addition, as shown in FIG. 8, the quantum dot semiconductor light emitting device in this embodiment is constituted as a ridge waveguide type quantum dot semiconductor light emitting device (ridge waveguide type quantum dot DFB laser) having a ridge structure (stripe structure; stripe-shaped mesa structure) 8 including a p-type GaAs contact layer 6X and the p-type AlGaAs upper cladding layer 5X.

The upper surface of the quantum dot active layer 3X is exposed over the opposite sides (both sides) of the ridge structure 8. Namely, the quantum dot active layer 3X extends to the end face of the n-type GaAs substrate 1X.

Since other constitutions are the same as those of the first embodiment and the modification, the description is omitted.

In addition, in the method for manufacturing the semiconductor light emitting device, although this embodiment is different from the first embodiment and the modification in that the GaAs guide layer 4 is formed before the formation of the quantum dot active layer 3X, the other processes are basically the same as the first embodiment and the modification, the description is omitted. The first growth may use the MOCVD method.

Thus, the semiconductor light emitting device and the method for manufacturing the semiconductor light emitting device according to this embodiment have the same effect as the first embodiment and the modification.

In the third embodiment, although the undoped InAs quantum dot active layer 3X is used, as with the first and second embodiments and these modifications, the p-type quantum dot active layer may be used for example. However, in this case, since the p-n junction area becomes large, it is necessary to pay attention to that the capacitance of the device is increased, whereby it is unsuitable for a high speed modulation operation.

In addition, in the third embodiment, as shown in FIGS. 9(A) and 9(B), the p-type AlAs current blocking layer (or p-type AlGaAs current blocking layer) 21X having a current blocking part 21AX may be provided adjacent to the side of the ridge structure (ridge waveguide) 8 so as to be sandwiched with the p-type AlGaAs upper cladding layer 5X [see, FIG. 9(A)], or may be provided between the quantum dot active layer 3X and the p-type AlGaAs upper cladding layer 5X [see, FIG. 9(B)].

Further, in the third embodiment, the composition ratio between the p-AlGaAs cladding layer and the n-AlGaAs cladding layer is not limited to the above ratio. The composition of the upper and lower cladding layers are not required to be the same.

Further, in the third embodiment, as with the case of the first embodiment and the modification, the presence or absence of doping in the InGaP diffraction grating and the guide layer, the growth method and the frequency of growth, the depth of the ridge, the method for ridge formation, the method for diffraction grating formation, a diffraction grating material, the number of stacked layers in the quantum dot active layer, the AlGaAs composition ratio in the cladding layer, a cladding layer material, the presence or absence of the λ/4 wavelength shift structure in the diffraction grating, and so on can be changed into various forms.
[Other]

In each embodiment and modification, although the semiconductor light emitting device, in which the quantum dot active layers 3 and 3X formed from the InAs-based compound semiconductor material are respectively formed on the GaAs substrates 1 and 1X, is described, it is not limited thereto.

For instance, the semiconductor light emitting device can be constituted to have a quantum dot active layer formed from other semiconductor material (for example, a quantum dot active layer formed from a semiconductor material based on other material capable of constituting a semiconductor laser). For example, there are a quantum dot active layer formed from an InAsSb-based compound semiconductor material which can be produced on the GaAs substrate, a quantum dot active layer formed from InNAs-based compound semiconductor material which can be produced on the GaAs substrate, and a quantum dot active layer formed from an InNAsSb-based compound semiconductor material.

In the above embodiments and modifications, although the semiconductor light emitting device is constituted to be formed on the n-type conductive substrate 1X or the p-type conductive substrate 1, it may be formed on a high resistance substrate, for example. By way of the example, the semiconductor light emitting device can be constituted as a lateral current injection type semiconductor light emitting device (a lateral current injection type semiconductor laser) formed on the high resistance substrate.

Figure 10:
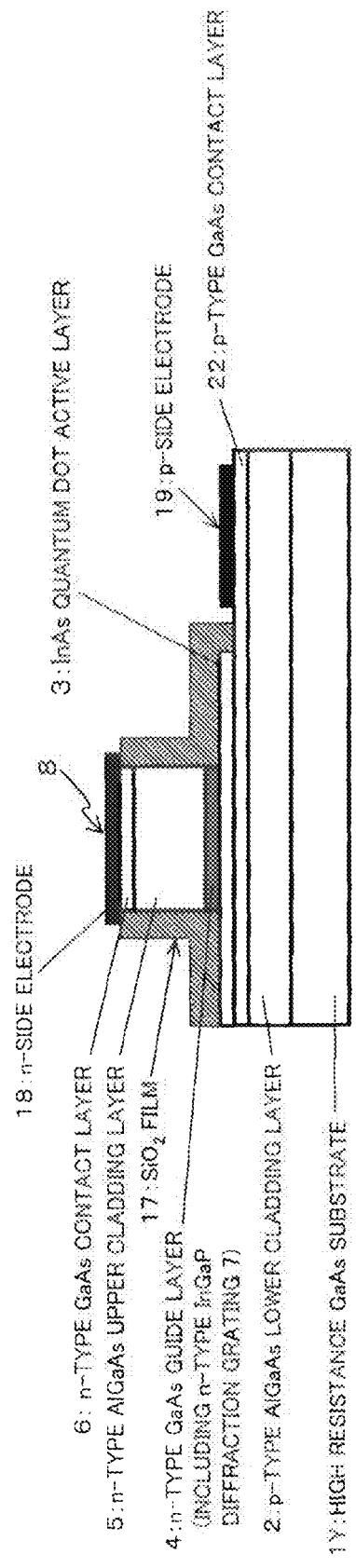
FIG. 10 is a schematic cross sectional view showing a constitution of a semiconductor light emitting device (quantum dot DFB laser) according to a modification of each embodiment.

Here, as shown in FIG. 10, the lateral current injection type semiconductor light emitting device has a stacked structure in which a p-AlGaAs lower cladding layer 2, a p-GaAs contact layer 22, a quantum dot active layer 3, an n-GaAs guide layer (n-GaAs layer) 4 including an n-InGaP diffraction grating 7, an n-AlGaAs upper cladding layer 5, and an n-GaAs contact layer 6 are sequentially stacked on a high-resistance GaAs substrate 1Y, and has a ridge structure 8 including the n-GaAs guide layer 4, the n-AlGaAs upper cladding layer 5, and the n-GaAs contact layer 6. The lateral current injection type semiconductor light emitting device has on its surface an insulating film (SiO$_2$ film) 17 formed from SiO$_2$, an n-side electrode 18, and a p-side electrode 19.

Specifically, in comparison with the constitution of the first embodiment (see, FIG. 2), in the constitution of this embodiment, a high resistance GaAs substrate 1Y is used, the high-resistance GaAs substrate 1Y and the p-AlGaAs lower cladding layer 2 are extended, the p-GaAs contact layer 22 is provided between the p-AlGaAs lower cladding layer 2 and the quantum dot active layer 3, and the p-side electrode 19 is provided on the p-GaAs contact layer 22. Although this embodiment is described as the modification of the first embodiment, it can be constituted as a modification of the second and third embodiments, for example.

In addition, in each embodiment and modification, while the semiconductor light emitting device is constituted as a distributed feed-back laser (DFB laser) having a diffraction grating, it can be constituted as a distributed Bragg reflector laser (DBR laser) having a diffraction grating.

Further, in each embodiment and modification, although the semiconductor laser of a 1.3 μm wavelength band is described as an example, the invention can be widely applied to a semiconductor laser (semiconductor light emitting device) with a wavelength band of the operation wavelength longer than 1 μm, such as a semiconductor layer of a 1.2 μm wavelength band used in a short range LAN, for example, and a semiconductor laser of a 1.06 μm wavelength band used for YAG laser excitation.

Further, in each embodiment and modification, although the ridge waveguide type semiconductor light emitting device is described as an example, the invention can be applied to a buried-type semiconductor light emitting device which has a stripe-shaped mesa structure (stripe structure) and a buried-heterostructure such as a pn buried structure and a high resistance buried structure.

Further, the invention is not limited to the above-mentioned embodiments, and various changes may be made without departing from the spirit and scope of the present invention.

What is claimed is:

1. A method for manufacturing a semiconductor light emitting device comprising:
    forming a lower cladding layer over a GaAs substrate;
    forming a quantum dot active layer over the lower cladding layer;
    forming an InGaP layer or an InGaAsP layer on an uppermost GaAs layer of the quantum dot active layer or on a first GaAs layer being formed over the quantum dot active layer;

forming an InGaP diffraction grating or an InGaAsP diffraction grating which is the InGaP layer or the InGaAsP layer separated in a narrow line-shape by etching the InGaP layer or the InGaAsP layer periodically such that the uppermost GaAs layer or the first GaAs layer is exposed;

forming a second GaAs layer burying the InGaP diffraction grating or the InGaAsP diffraction grating so as to be in contact with the uppermost GaAs layer or the first GaAs layer; and forming an upper cladding layer having a conductive type different from that of the lower cladding layer over the second GaAs layer, wherein the processes after the forming the quantum dot active layer are performed at a temperature not thermally deteriorating or degrading quantum dots included in the quantum dot active layer.

2. The method for manufacturing a semiconductor light emitting device as claimed in claim 1, further comprising:

forming a GaAs cap layer over the InGaP layer or the InGaAsP layer after the forming the InGaP layer or the InGaAsP layer and before the forming the InGaP diffraction grating or the InGaAsP diffraction grating;

wherein, in the forming the InGaP diffraction grating or the InGaAsP diffraction grating, the InGaP diffraction grating or the InGaAsP diffraction grating having the GaAs cap layer in an upper part thereof which is the GaAs cap layer and the InGaP layer or the InGaAsP layer separated in a narrow-line shape is formed by etching the GaAs cap layer and the InGaP layer or the InGaAsP layer periodically such that the uppermost GaAs layer or the first GaAs layer is exposed; and in the forming the second GaAs layer, the second GaAs layer is formed so as to bury the InGaP diffraction grating or the InGaAsP diffraction grating having the GaAs cap layer in an upper part thereof and so as to be in contact with the uppermost GaAs layer or the first GaAs layer.

3. The method for manufacturing a semiconductor light emitting device as claimed in claim 1, wherein the processes after the forming the quantum dot active layer are performed at a temperature of 630° C. or less.

* * * * *